(12) United States Patent
Shibata

(10) Patent No.: US 6,717,274 B2
(45) Date of Patent: Apr. 6, 2004

(54) SEMICONDUCTOR DEVICE HAVING A WARP PREVENTING SHEET

(75) Inventor: Kazutaka Shibata, Kyoto (JP)

(73) Assignee: Rohm Co., Ltd., Kyoto (JP)

(*) Notice: Subject to any disclaimer, the term of this patent is extended or adjusted under 35 U.S.C. 154(b) by 0 days.

(21) Appl. No.: 10/091,544

(22) Filed: Mar. 7, 2002

(65) Prior Publication Data
US 2003/0168723 A1 Sep. 11, 2003

(30) Foreign Application Priority Data
Mar. 8, 2001 (JP) ........................ 2001-064505

(51) Int. Cl.⁷ .............................................. H01L 23/48
(52) U.S. Cl. ....................... 257/778; 257/779; 257/780; 257/707
(58) Field of Search ................. 257/778, 779, 257/780, 707

(56) References Cited

U.S. PATENT DOCUMENTS 5,895,976 A * 4/1999 Morrell et al. ............. 257/778
6,188,127 B1 * 2/2001 Senba et al. ................ 257/686

* cited by examiner

*Primary Examiner*—Luan Thai
(74) *Attorney, Agent, or Firm*—Rabin & Berdo, PC

(57) ABSTRACT

A semiconductor device provided with a semiconductor chip having one surface bonded to a substrate, and the other surface bonded to a warp preventing sheet. Preferably, the warp preventing sheet has a coefficient of elasticity substantially equal to that of the substrate, or a coefficient of thermal expansion substantially equal to that of the substrate. Preferably, the base of the warp preventing sheet is made of material identical with that of the base of the substrate, and more preferably, the warp preventing sheet and the substrate are substantially equal in thickness to each other.

10 Claims, 1 Drawing Sheet

SEMICONDUCTOR DEVICE HAVING A WARP PREVENTING SHEET

BACKGROUND OF THE INVENTION

1. Field of the Invention

The present invention relates to a thin semiconductor device comprising a semiconductor chip bonded to the substrate.

2. Description of Related Art

To reduce the mounting area of a semiconductor device, there is put to practical use a chip-size package serving as an IC package of which size is substantially equal to that of a semiconductor chip itself. In an example of a semiconductor device of the chip-size package type, a semiconductor chip is bonded to a substrate called an interposer. For example, a plurality of bumps are disposed at the periphery of the active surface of the semiconductor chip and bonded to the interposer substrate. For example, a plurality of soldering balls are disposed, in a grid-pattern two-dimensional arrangement, on the surface of the interposer substrate which is opposite to the surface thereof facing the semiconductor chip. Disposed inside of the interposer substrate are multilayer wirings for wiring the bumps to the soldering balls in a two-dimensional arrangement.

Recently, to further reduce a chip-size package in thickness, it has been tried to grind the non-active surface of a semiconductor chip or to reduce a thickness of the interposer substrate. This disadvantageously reduces the rigidity of the chip-size package, causing the same to be undesirably warped at the time of storage or assembling. This involves the likelihood that when mounting such a warped chip-size package on a mounting board, all the soldering balls cannot always securely be bonded to the lands on the mounting board. More specifically, there is a possibility of elements being defectively mounted.

SUMMARY OF THE INVENTION

It is an object of the present invention to provide a semiconductor device so arranged as to prevent warp.

According to the present invention, a semiconductor device comprises: a substrate; a semiconductor chip having one surface bonded to the surface of the substrate; and a warp preventing sheet bonded to the other surface of the semiconductor chip. According to the arrangement above-mentioned, the semiconductor chip will expand and contract substantially equally at both surfaces thereof. Therefore, even though the semiconductor chip is made thin, it is possible to prevent the occurrence of undesired warp.

Preferably, the warp preventing sheet has a coefficient of elasticity substantially equal to that of the substrate. For example, the warp preventing sheet preferably has a coefficient of elasticity not less than 1/10 of the coefficient of elasticity of the substrate and not greater than 10 times the coefficient of elasticity of the substrate. According to the arrangement above-mentioned, the semiconductor device can effectively be prevented from being warped.

Preferably, the warp preventing sheet has a coefficient of thermal expansion substantially equal to that of the substrate. For example, the warp preventing sheet preferably has a coefficient of thermal expansion not less than 1/10 of the coefficient of thermal expansion of the substrate and not greater than 10 times the coefficient of thermal expansion of the substrate. According to the arrangement above-mentioned, the semiconductor chip will thermally expand and contract equally at both surfaces thereof. Thus, the semiconductor device can effectively be prevented from being warped.

Preferably, the base of the warp preventing sheet is made of material identical with that of the base of the substrate. According to the arrangement above-mentioned, the semiconductor chip will expand and contract equally at both surfaces thereof. This can prevent the semiconductor device from being warped.

More specifically, the base of each of the substrate and the warp preventing sheet may be a polyimide resin.

Preferably, the warp preventing sheet has a thickness substantially equal to that of the substrate. According to the arrangement above-mentioned, the semiconductor device can more securely be prevented from being warped. In particular, when the warp preventing sheet and the substrate which are made of the base having the same material, are made equal in thickness to each other, both surfaces of the semiconductor chip can be made equal in condition to each other. This securely prevents the semiconductor device from being warped.

These and other features, objects, advantages and effects of the present invention will be more fully apparent from the following detailed description set forth below when taken in conjunction with the accompanying drawings.

DESCRIPTION OF THE PREFERRED EMBODIMENTS

Figure 1:
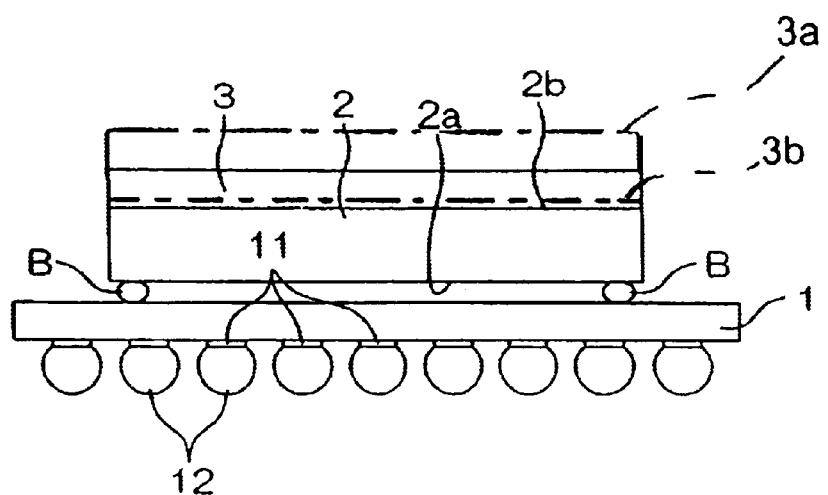
FIG. 1 is a schematic section view illustrating the arrangement of a semiconductor device according to an embodiment of the present invention.

FIG. 1 is a schematic section view illustrating the arrangement of a semiconductor device according to an embodiment of the present invention. This semiconductor device is a so-called chip-size package thin semiconductor device, and has a structure in which a semiconductor chip 2 is bonded to the surface of a tape-like interposer substrate 1 with the active surface 2a of the semiconductor chip 2 facing thereto.

Bumps B connected to an internal circuit formed inside of the semiconductor chip 2, are disposed on the active surface 2a of the semiconductor chip 2, for example at the periphery thereof. These bumps B are respectively bonded to lands (not shown) formed on the surface of the interposer substrate 1.

Lands 11, for example in a grid-pattern two-dimensional arrangement, are formed on the reverse face of the interposer substrate 1 which is opposite to the surface thereof facing the semiconductor chip 2. Respective soldering balls 12 are formed as adhering to the lands 11. The interposer substrate 1 incorporates multi-layer wirings for wiring the surface lands bonded to the bumps B, to the reverse lands 11 bonded to the soldering balls 12.

A warp preventing sheet 3 is bonded to the non-active surface 2b of the semiconductor chip 2 by adhesives for example. This warp preventing sheet 3 has a coefficient of elasticity substantially identical with that of the interposer substrate 1, and has a coefficient of thermal expansion also substantially identical with that of the interposer substrate 1. More specifically, for example the base of the interposer substrate 1 is made of a polyimide resin, and the base of the warp preventing sheet 3 is also made of a polyimide resin which is the same as that of the interposer substrate 1.

Further, the interposer substrate 1 made for example in the form of a tape, is substantially equal in thickness to the warp preventing sheet 3. More specifically, the warp preventing sheet 3 is made in the form of a tape or a film.

The semiconductor chip 2 may be for example a silicon chip, or may be formed by a semiconductor of other type such as a germanium semiconductor, a compound semiconductor (e.g., gallium arsenide, gallium phosphide) or the like.

According to the embodiment discussed in the foregoing, there is bonded, to the non-active surface 2b of the semiconductor chip 2, the warp preventing sheet 3 made of the same material of the interposer substrate 1 and having a thickness substantially equal to that of the interposer substrate 1. Thus, the semiconductor chip 2 is equally affected at the active surface 2a and the non-active surface 2b by environmental changes. This prevents the semiconductor device from being warped. Accordingly, even though the non-active surface 2b of the semiconductor chip 2 is ground to reduce the thickness thereof up to the lower limit, no wrap will result, thus achieving a semiconductor device which can successfully be mounted on a mounting board.

The foregoing has discussed an embodiment of the present invention. However, the present invention can also be embodied in different forms. For example, in the embodiment above-mentioned, both the interposer substrate 1 and the warp preventing sheet 3 are made of a polyimide resin. However, there may also be used, in addition to the polyimide resin, resin comprising an imide bond and/or an acid bond. Further, the interposer substrate 1 and the warp preventing sheet 3 are not always required to be made of the same material. More specifically, even though the substrate 1 and the sheet 3 are made of different materials, a warp preventing effect can be produced in the semiconductor device as far as the coefficient of elasticity and/or the coefficient of thermal expansion of the interposer substrate 1 are substantially equal to those of the warp preventing sheet 3.

When there interposer substrate 1 and the warp preventing sheet 3 are made of different materials, there are instances where it is not preferable to make their thicknesses equal to each other, but it is preferable to make their thicknesses different from each other, as shown by the dashed lines 3a and 3b, such that their coefficients of elasticity and/or coefficients of thermal expansion are equal to each other.

Embodiments of the present invention have been discussed in detail, but these embodiments are mere specific examples for clarifying the technical contents of the present invention. Therefore, the present invention should not be construed as limited to these specific examples. The spirit and scope of the present invention are limited only by the appended claims.

This Application corresponds to Japanese Patent Application Serial No. 2001-64505 filed on Mar. 8, 2001 with Japanese Patent Office, the disclosure of which is incorporated herein by reference.

What we claim is:

1. A semiconductor device, comprising:
   a substrate;
   a semiconductor chip having one surface bonded to a surface of the substrate; and
   a warp preventing sheet bonded to and entirely covering the other surface of the semiconductor chip, wherein end surfaces of the warp preventing sheet are flush with corresponding end surfaces of the semiconductor chip, wherein the warp preventing sheet has a coefficient of elasticity substantially equal to that of the substrate.

2. A semiconductor device according to claim 1, wherein the semiconductor device is a thin semiconductor device of a chip-size package type.

3. A semiconductor device, comprising:
   a substrate;
   a semiconductor chip having one surface bonded to a surface of the substrate; and
   a warp preventing sheet bonded to and entirely covering the other surface of the semiconductor chip, wherein end surfaces of the warp preventing sheet are flush with corresponding end surfaces of the semiconductor chip, wherein the warp preventing sheet has a coefficient of thermal expansion substantially equal to that of the substrate.

4. A semiconductor device according to claim 3, wherein the semiconductor device is a thin semiconductor device of a chip-size package type.

5. A semiconductor device, comprising:
   a substrate;
   a semiconductor chip having one surface bonded to a surface of the substrate; and
   a warp preventing sheet bonded to and entirely covering the other surface of the semiconductor chip, wherein end surfaces of the warp preventing sheet are flush with corresponding end surfaces of the semiconductor chip, wherein a base of the warp preventing sheet is made of material identical with that of a base of the substrate.

6. A semiconductor device according to claim 5, wherein the warp preventing sheet has a thickness substantially equal to that of the substrate.

7. A semiconductor device according to claim 5, wherein the semiconductor device is a thin semiconductor device of a chip-size package type.

8. A semiconductor device, comprising:
   a substrate;
   a semiconductor chip having one surface bonded to a surface of the substrate; and
   a warp preventing sheet bonded to and entirely covering the other surface of the semiconductor chip, wherein end surfaces of the warp preventing sheet are flush with corresponding end surfaces of the semiconductor chip, wherein a base of each of the substrate and the warp preventing sheet is a polymide resin.

9. A semiconductor device according to claim 8, wherein the semiconductor device is a thin semiconductor device of a chip-size package type.

10. A semiconductor device comprising:
    a substrate;
    a semiconductor chip having one surface bonded to a surface of the substrate; and
    a warp preventing sheet bonded to the other surface of the semiconductor chip, wherein
    the substrate and the warp preventing sheet are fabricated from different materials and a substrate thickness of the substrate and a warp preventing sheet thickness of the warp preventing sheet are different from each other yet respective ones of at least one of the coefficients of elasticity and coefficients of thermal expansion are equal to each other.

* * * * *